United States Patent [19]

Masenas, Jr.

[11] 4,376,252
[45] Mar. 8, 1983

[54] BOOTSTRAPPED DRIVER CIRCUIT

[75] Inventor: Charles J. Masenas, Jr., Jericho, Vt.

[73] Assignee: International Business Machines Corporation, Armonk, N.Y.

[21] Appl. No.: 181,318

[22] Filed: Aug. 25, 1980

[51] Int. Cl.³ .................... H03K 19/01; H03K 17/04; H03K 17/12; H03K 19/088

[52] U.S. Cl. .................. 307/482; 307/270; 307/456; 307/578

[58] Field of Search ............... 307/246, 482, DIG. 4, 307/456-458, 270, 578

[56] References Cited

U.S. PATENT DOCUMENTS

| | | | |
|---|---|---|---|
| 3,656,004 | 4/1972 | Kemerer et al. | 307/246 X |
| 3,751,680 | 3/1972 | Hodges | 307/458 |
| 3,987,310 | 10/1976 | Peltier et al. | 307/458 OR |
| 4,071,783 | 1/1978 | Knepper | 307/246 X |
| 4,129,790 | 12/1978 | Gani et al. | 307/458 X |
| 4,191,899 | 3/1980 | Tomczak et al. | 307/303 OR |

Primary Examiner—Larry N. Anagnos
Assistant Examiner—David R. Hudspeth
Attorney, Agent, or Firm—Stephen J. Limanek

[57] ABSTRACT

A driver circuit charges a capacitive load to a voltage substantially equal to the voltage or potential of the power supply of the circuit by first charging the capacitive load with current flowing through a drive transistor under the control of the power supply potential and, thereafter, at a predetermined time charging the capacitive load under the control of a precharged bootstrap capacitor. The driver circuit includes a transistor, acting as a pull-up device, connected between the power supply and the capacitive load and a series circuit including a charge source and switching means connected between the capacitive load and a control gate of the transistor. The switching means is coupled to the capacitive load so as to be responsive to the voltage at the load for directing charge from the charge source into the pull-up transistor at a predetermined time to raise the voltage at the capacitive load to substantially the potential of the power supply.

21 Claims, 2 Drawing Figures

1

BOOTSTRAPPED DRIVER CIRCUIT

DESCRIPTION

1. Technical Field

This invention relates to integrated circuits for charging and discharging a capacitive load and more particularly to circuits, such as interface driver circuits, capable of charging the capacitive load to substantially the full potential of the circuit's power supply.

2. Background Art

In the design of integrated circuits, there are many instances when low voltage signals from bipolar circuits need to be converted to relatively high voltage signals for driving high capacitance field effect transistor circuits. Furthermore, since field effect transistors are prone to provide voltage drops of one threshold voltage per logic stage, since the amount of heat dissipated by a driver circuit is a function of the square of the potential supplied to the circuit, and since the cost of a power supply increases in magnitude with the increase in supply potential, it is very important to use a driver circuit responsive to the low voltage signals which will produce an output voltage having a magnitude substantially equal to that of the power supply.

In commonly assigned U.S. Pat. No. 3,656,004, filed Sept. 28, 1970 by D. W. Kemerer and J. N. Pomeranz, there is disclosed a driver circuit which charges its capacitive output load to substantially the full potential of its power supply by decoupling from the power supply the base of the driving transistor, coupled between the capacitive load and the power supply and driving this transistor with charge accumulated in the base-emitter of the transistor.

In commonly assigned U.S. Pat. No. 4,191,899, filed June 29, 1977 by J. J. Tomczak and R. N. Wilson, there is also disclosed a driver circuit which charges its capacitive output load to substantially the full potential of its power supply by utilizing a bootstrap capacitor formed by a transistor-like structure.

DISCLOSURE OF THE INVENTION

It is an object of this invention to provide an improved driver circuit for a capacitive load.

It is another object of this invention to provide an improved high performance driver circuit for a capacitive load which produces output signals of substantially the same magnitude as that of the power supply of the circuit.

It is yet another object of this invention to provide an improved driver circuit for a capacitive load producing high output signals or voltages with low power dissipation.

It is a further object of this invention to provide an improved driver circuit for a capacitive load producing high output signals which can be fabricated in substantially any process at a high density on integrated circuit chips.

It is still a further object of this invention to provide an improved driver circuit for a capacitive load producing high output signals or voltages which requires a power supply producing an output voltage having a magnitude substantially no greater than that of the output signals or voltages.

Yet a further object of this invention is to provide an improved driver circuit for a capacitive load producing high output signals which utilizes a feedback capacitor providing an overshoot drive.

In accordance with the teachings of this invention an improved driver circuit is provided for rapidly and efficiently charging a capacitive load to a voltage substantially equal to the voltage or potential of the power supply of the circuit by first charging the capacitive load with current flowing through a drive transistor under the control of the power supply potential and thereafter at a predetermined time charging the capacitive load under the control of a precharged bootstrap capacitor.

In an embodiment of the present invention, the driver circuit includes a transistor, acting as a pull up device, connected between the power supply and the capacitive load and a series circuit including a charge source and switching means connected between the capacitive load and a control gate of the transistor. The switching means is coupled to the capacitive load so as to be responsive to the voltage at the load for discharging charge from the charge source into the pull up transistor at a predetermined time in order to raise the voltage at the capacitive load to substantially the potential of the power supply.

The foregoing and other objects, features and advantages of the invention will be apparent from the following and more particular description of the preferred embodiments of the invention, as illustrated in the accompanying drawing.

BEST MODE FOR CARRYING OUT THE INVENTION

Figure 1:
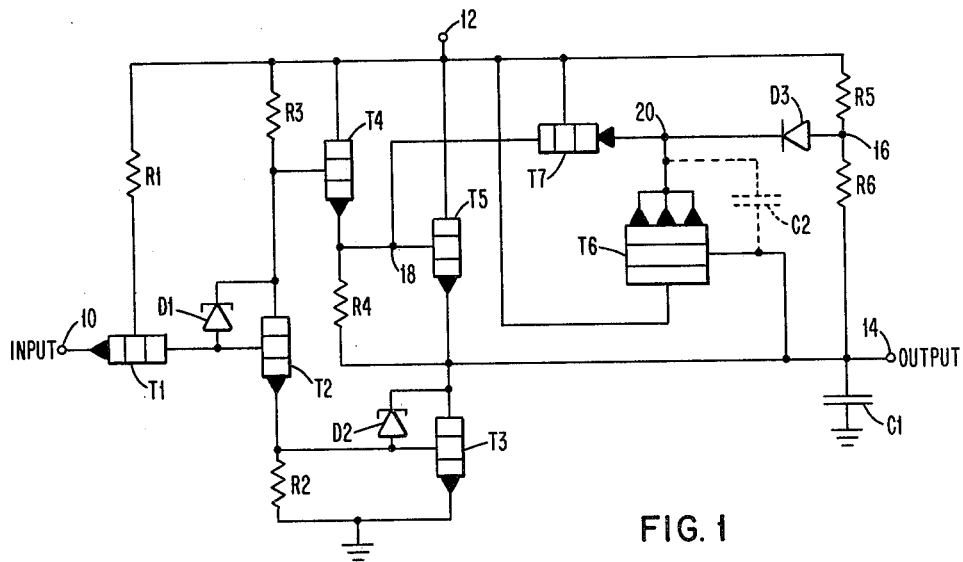
FIG. 1 is a circuit diagram illustrating an embodiment of the present invention.

Referring to FIG. 1 in more detail, there is shown a circuit diagram of an embodiment of the present invention. The circuit of FIG. 1 is a driver circuit which includes a first bipolar transistor T1 having an emitter connected to an input terminal 10, a collector connected to a first cascade-connected transistor T2 of a pair of cascade transistors, the other being a second cascade-connected or pull-down transistor T3. The base of the input transistor T1 is connected to a power supply terminal 12 through a first resistor R1. The emitter of the first cascade-connected transistor T2 is coupled to the base of the pull-down transistor T3 and to a point of reference potential, such as ground, through a second resistor R2. The collector of the first cascade-connected transistor T2 is connected to the power supply terminal 12 through a third resistor R3. A first Schottky diode D1, acting as a clamp, is connected across the base-collector junction of the first cascade-connected transistor T2 and a second Schottky diode D2, also acting as a clamp, is connected across the base-collector junction of the pull-down transistor T3. The emitter of the pull-down transistor T3 is connected to the point of reference potential and the collector of the pull-down transistor T3 is connected to an output terminal 14 to which is connected a relatively high capacitive load indicated by capacitor C1, e.g., having a capacitance value of approximately 12 to 700 picofarads.

A first transistor T4 of a Darlington pair of transistors, which also includes a second or pull-up transistor T5, has its base connected to the power supply terminal 12 through the third resistor R3, its collector connected directly to the power supply terminal 12 and its emitter connected to the base of the pull-up transistor T5 and also to the output terminal 14 through a fourth resistor R4. The emitter of the pull-up transistor T5 is connected directly to the output terminal 14 and its collector is connected directly to the power supply terminal 12. Each of the transistors T1, T2, T3, T4 and T5 is illustrated as being an NPN transistor. The input terminal 10 preferably has standard transistor-transistor logic, $T^2L$, voltages applied thereto which vary between a minimum of 0.6 volts to a maximum of approximately 2.4 volts and the potential of the power supply at terminal 12 is preferably +8.5 volts, although a lower voltage may be used, if desired.

A voltage divider circuit having series connected fifth and sixth resistors R5 and R6 is connected between the output terminal 14 and the power supply terminal 12. The common point or node between the resistors R5 and R6 is identified by reference numeral 16. A multi-emitter transistor T6, which is illustrated as an NPN transistor, has its collector connected to the power supply terminal 12, its base connected to the output terminal 14 and its emitters connected to the common point or node 16 of the voltage divider R5, R6 through a third diode D3. The multi-emitter transistor T6, if desired, may be a large single emitter transistor, but in either case it should be formed so as to provide a large emitter-base capacitance indicated by dashed lines as capacitor C2. A switching device, illustrated as a PNP transistor T7, has its collector connected to the base of the pull-up transistor T5, its emitter connected to the emitters of the multi-emitter transistor T6 and its base connected to the power supply terminal 12.

Figure 2:
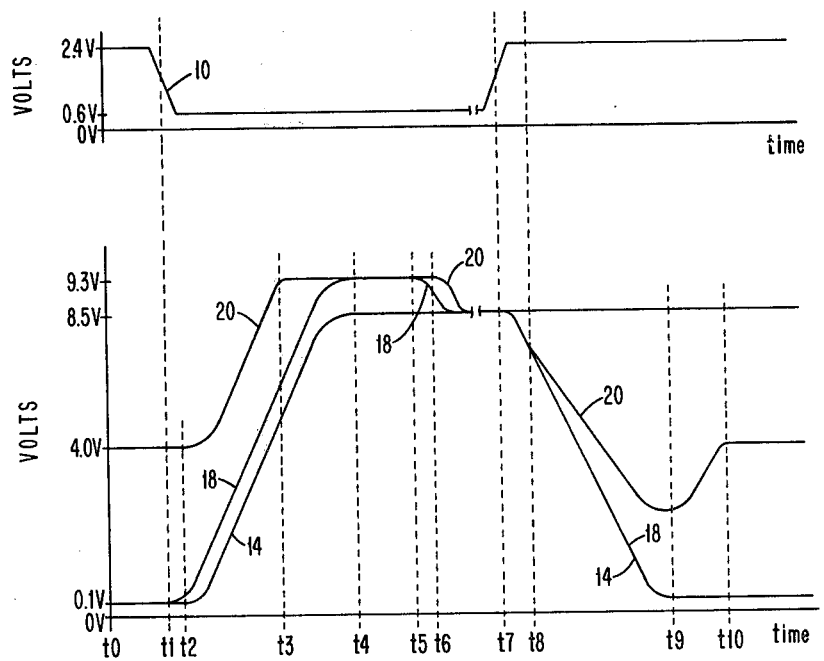
FIG. 2 is a graph of the voltage with respect to time at a number of nodes or terminals within the circuit of the present invention illustrated in FIG. 1 of the drawing.

To better understand the operation of the circuit of FIG. 1, reference may be had to the graph shown in FIG. 2 of the drawing. With +2.4 volts applied to the input node or terminal 10, as indicated at a t0 in FIG. 2 of curve 10, transistor T1 is turned off turning on transistors T2 and T3. With transistor T3 turned on charge stored on capacitor C1 at the output terminal 14 is discharged through transistor T3 to the point of reference potential or ground, dropping the voltage at the output terminal 14 to the saturation voltage of the transistor T3, i.e., to approximately 100 millivolts, as indicated by curve 14 in FIG. 2 at time t0. With transistor T2 turned on, the Darlington pair, transistors T4 and T5 are turned off and the voltage at node 18 is also at approximately 100 millivolts. Since the output terminal 14 is at a low voltage, current passes through the resistors R5 and R6 of the voltage divider producing a voltage at node 16 that is applied through the third diode D3 to the emitters of the multi-emitter transistor T6 to charge up the second capacitor C2 to preferably 4 volts. This voltage, as is well known, may be varied, as desired, by simply changing the values of the resistors R5 and R6. However, it should be understood that the voltage across capacitor C2 should not be so large as to cause a breakdown in transistor T6. The voltage at node 20 as shown in FIG. 2 by curve 20 is at approximately 4 volts at time t0. At time t0, the PNP transistor T7 is also off.

When the input voltage, indicated by curve 10 of FIG. 2, at the input terminal 10 is decreased to begin the positive transition of a cycle, transistor T1 turns on thus turning off the pair of cascade-connected transistors T2 and T3, with the Darlington pair transistors T4 and T5 now turning on. With transistor T4 turning on, current flows through the fourth resistor R4 increasing the voltage on node 18 at time t1. Shortly thereafter, at time t2, the voltage at the output terminal 14 begins to increase as indicated by curve 14. With the voltage at output terminal 14 increasing, the voltage at node 20 also begins to increase at the same rate with a magnitude equal to the voltage at the output terminal plus the voltage stored in the second capacitor C2. As also shown in FIG. 2, the voltage at node 18 continues to rise at the same rate as the voltage at the output terminal 14 with a magnitude equal to that of the output voltage plus one base-emitter voltage drop, Vbe. These voltages continue to rise uniformly up to time t3. At time t3, the voltage at node 20 reaches a value which is equal to the potential of the power supply terminal 12 plus one Vbe which is of sufficient magnitude to turn on the PNP transistor T7. It should be understood that at time t3 the voltage at the output terminal 14 has increased to approximately two Vbe's below the potential of the power supply terminal without discharging capacitor C2. This is approximately the highest output voltage at terminal 14 that the Darlington pair T4 and T5 can produce without the aid of other circuitry. However, with the second capacitor C2 charged to 4 volts and the PNP transistor T7 turned on, capacitive current from the second capacitor C2 begins to flow into transistor T5 to continue to supply charge to the capacitive load C1, increasing the voltage at output terminal 14 until it reaches approximately the potential of the power supply terminal 12. The voltage at node 20 now remains constant since the PNP transistor is forward biased. Since the PNP transistor T7 is on, the voltage at node 18 will continue to increase until it reaches the magnitude of the voltage at node 20, which value is reached at time t4. At time t4, saturation commences and the voltages at nodes 14, 18 and 20 remain constant for a period of time, which is indicated between times t4 and t5. At time t5 the voltage at node 18 will begin to drop due to the presence of the fourth resistor R4 connected to the output terminal 14. Some time thereafter, such as at time t6, due to leakage, the voltage at node 20 will also decrease to approximately 8.5 volts, i.e., to the voltage at the output terminal 14. With the input voltage held at the low voltage of 0.6 volts, the output voltage will remain at the power supply potential of approximately 8.5 volts for an indefinite period of time.

To initiate the negative transition of the cycle, i.e., to discharge the output capacitor C1, the voltage at the input terminal 10 is increased so that at time t7 the input transistor T1 is turned off which then turns on transistors T2 and T3. With the pull-down transistor T3 turned on, the output capacitor C1 is discharged toward ground, along with node 18, decreasing the voltage at output terminal 14 and node 18 to approximately 100 millivolts. When the voltage at node 20 decreases to one Vbe of the diode D3 below the power supply terminal 12 at time t8, the second capacitor C2 begins to be re-charged by the voltage at node 16. Of course it should be understood that although the second capacitor C2 is now being re-charged, the voltage at node 20 continues to decrease, as indicated in FIG. 2, due to the rapid decrease of the voltage at the output terminal 14. As soon as the voltage at the output terminal 14 reaches its low potential at time t9, the potential on node 20 begins to increase until it reaches 4.0 volts due to the charge being applied to the second capacitor C2 from node 16 of the voltage divider R5 and R6. At time t10 the second capacitor C2 is re-charged to 4.0 volts and thus the voltage on node 20 is approximately 4.0 volts. With the input voltage remaining at 2.4 volts, the circuit will continue to hold the output voltage at its low value of approximately 100 millivolts until the next cycle of operation begins by again decreasing the input voltage from 2.4 volts to 0.6 volts.

It should be noted that an improved driver circuit has been provided which produces an output voltage having a magnitude substantially equal to that of the power supply terminal 12 by providing a driver circuit which includes the series circuit of the second capacitor C2 and the switching device, transistor T7, connected between the output terminal 14 and the base of the pull-up transistor T5. In accordance with the operation of this circuit, the Darlington pair transistors T4 and T5 increase the output voltage during the positive transition to a magnitude approximately equal to two Vbe's below the potential of the power supply terminal 12. At this point the voltage at node 20 has increased to a magnitude which is approximately one Vbe above the potential of the power supply terminal 12 turning on the PNP transistor T7, which now directs the charge from the second capacitor C2 to the pull-up transistor T5 to raise the voltage at the output terminal from the power supply potential minus two Vbe's to approximately the magnitude of the potential of power supply terminal 12. By providing the switching transistor T7, as arranged in the circuit illustrated in FIG. 1 of the drawing, the charge stored in the second capacitor C2 is utilized more fully and more efficiently for raising the voltage at the output terminal 14 to the power supply potential since the charge on capacitor C2 is not being wasted during the time period when the Darlington pair T4 and T5 are charging the output terminal to approximately the power supply potential minus two Vbe's. Furthermore, more charge is taken out of capacitor C2 since it is discharged to within a voltage of one Vbe, i.e., to about 0.8 volts from a high voltage of 4.0 volts. It should also be noted that the multi-emitter transistor T6 is connected so that the PNP transistor T7 transfers stored charge from a reverse biased P-N junction to the capacitive output load at terminal 14 via pull-up transistor T5. This circuit provides better overshoot, uses less power, and is faster than other known driver circuits, without the need of a high number of transistors or other circuit elements.

While the invention has been particularly shown and described with reference to preferred embodiments thereof, it will be understood by those skilled in the art that various changes in form and details may be made therein without departing from the spirit and scope of the invention.

What is claimed is:

1. A driver circuit comprising;
a pull up device having a control gate connected between a voltage supply source and an output terminal, and
a series circuit including a charge source and switching means connected between said output terminal and the control gate of said pull up device, said switching means being responsive to the voltage at said output terminal for isolating said charge source from the control gate of said pull up device during a first period of time and for directing charge from said charge source into said pull up device during a second period of time.

2. A driver circuit as set forth in claim 1 wherein said charge source includes a capacitor.

3. A driver circuit as set forth in claim 1 wherein said switching means includes a transistor.

4. A driver circuit as set forth in claim 3 wherein said transistor is a PNP transistor.

5. A driver circuit as set forth in claim 4 wherein said PNP transistor has an emitter coupled to said charge source.

6. A driver circuit as set forth in claim 5 wherein said PNP transistor has a base connected to said voltage supply source and a collector connected to the control gate of said pull up device.

7. A driver circuit as set forth in claim 1 wherein said pull up device is a transistor.

8. A driver circuit as set forth in claim 1 wherein said pull up device is a first transistor and said switching means is a second transistor.

9. A driver circuit as set forth in claim 8 wherein said second transistor is a PNP transistor having a collector connected to the base of said first transistor.

10. A driver circuit as set forth in claim 9 further including a Darlington transistor pair which includes said first transistor.

11. A driver circuit as set forth in claim 1 wherein said charge source is a capacitor and further including means for charging said capacitor.

12. A driver circuit as set forth in claim 11 wherein said charging means includes a voltage divider having a tap connected between said voltage supply source and said output terminal and a device coupling said tap to said capacitor.

13. A driver circuit as set forth in claim 12 wherein said device is a diode.

14. A driver circuit as set forth in claim 13 wherein said capacitor includes a semiconductor P-N junction.

15. A driver circuit as set forth in claim 14 further including a transistor wherein said semiconductor P-N junction is a portion of said transistor.

16. A driver circuit comprising;
a pull up device having a control gate connected between a voltage supply source and an output terminal,
a first capacitor connected to said terminal,
a series circuit including a second capacitor and a transistor connected between said output terminal and the control gate of said pull up device, said transistor having an emitter-collector path serially connected with said second capacitor, and
means for charging said second capacitor.

17. A driver circuit as set forth in claim 16 wherein said charging means is connected between said voltage supply source and said output terminal.

18. A driver circuit as set forth in claim 17 wherein said charging means includes a voltage divider and a diode coupled to said voltage divider.

19. A bootstrapped bipolar driver circuit comprising;
a Darlington pair having first and second transistors,
an input circuit coupled to said first transistor,
a pull down transistor connected serially with said second transistor between a voltage supply source and a point of reference potential,
an output terminal connected to the common point between said pull down transistor and said second transistor,
a first capacitor connected to said output terminal,
a series circuit coupled between said output terminal and the base of said second transistor, said series circuit including a second capacitor and a PNP transistor, and means for charging said second capacitor.

20. A driver circuit as set forth in claim 19 wherein said PNP transistor has a collector connected to the base of said second transistor, a base connected to said voltage supply source and an emitter connected to said second capacitor.

21. A driver circuit comprising;

an NPN transistor having a control gate connected between a voltage supply source and an output terminal, a first capacitor connected to said terminal, a series circuit including a second capacitor and a PNP transistor connected between said output terminal and the control gate of said NPN transistor, said PNP transistor being responsive to the voltage at said output terminal, and means for charging said second capacitor.

* * * * *